United States Patent
Corisis (10) Patent No.: US 6,531,342 B2
(45) Date of Patent: *Mar. 11, 2003

(54) METHOD FOR TRANSVERSE HYBRID LOC PACKAGE

(75) Inventor: David J. Corisis, Meridian, ID (US)

(73) Assignee: Micron Technology, Inst., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/118,365

(22) Filed: Apr. 8, 2002

(65) Prior Publication Data

US 2002/0115277 A1 Aug. 22, 2002

Related U.S. Application Data (60) Continuation of application No. 09/832,539, filed on Apr. 11, 2001, now Pat. No. 6,406,943, which is a continuation of application No. 09/614,403, filed on Jul. 12, 2000, now Pat. No. 6,259,153, which is a continuation of application No. 09/302,196, filed on Apr. 29, 1999, now Pat. No. 6,150,710, which is a division of application No. 09/137,782, filed on Aug. 20, 1998, now Pat. No. 6,124,150.

(51) Int. Cl.$^7$ ............... H01L 21/44; H01L 21/48; H01L 21/50

(52) U.S. Cl. ............ 438/123; 438/118; 438/121; 438/124; 438/127

(58) Field of Search ............... 438/123, 118, 438/121, 124, 127

(56) References Cited

U.S. PATENT DOCUMENTS

| 4,033,844 A | 7/1977 | Pantiga et al. |
|---|---|---|
| 4,089,733 A | 5/1978 | Zimmerman |
| 4,279,682 A | 7/1981 | Hamagami et al. |
| 4,801,999 A | 1/1989 | Hayward et al. |
| 4,835,120 A | 5/1989 | Mallik et al. |
| 4,862,245 A | 8/1989 | Pashby et al. |
| 4,891,687 A | 1/1990 | Mallik et al. |
| 4,894,752 A | 1/1990 | Murata et al. |
| 4,937,656 A | 6/1990 | Kohara |
| 4,943,843 A | 7/1990 | Okinaga et al. |
| 4,984,059 A | 1/1991 | Kubota et al. |
| 4,989,068 A | 1/1991 | Yasuhara et al. |
| 5,126,821 A | 6/1992 | Okinaga et al. |
| 5,140,404 A | 8/1992 | Fogal et al. |
| 5,142,450 A | 8/1992 | Olson et al. |
| 5,184,208 A | 2/1993 | Sakuta et al. |
| 5,218,229 A | 6/1993 | Farnworth |
| 5,227,661 A | 7/1993 | Heinen |

(List continued on next page.)

FOREIGN PATENT DOCUMENTS

| EP | 576 021 A1 | 12/1993 |
|---|---|---|
| JP | 60-105658 | 6/1985 |
| JP | 2-156547 | 6/1990 |
| JP | 3-35589 | 2/1991 |

OTHER PUBLICATIONS

Louis T. Manzione, *Plastic Packaging of Microelectronic Devices*, 1990, pp. 156–347.

Caroline A. Kovac, *Plastic Package Fabrication*, pp. 470–482.

Primary Examiner—Albert W. Paladini
Assistant Examiner—David A. Zarneke
(74) Attorney, Agent, or Firm—TraskBritt (57) ABSTRACT

A hybrid semiconductor package is formed from a die having two opposed elongate die edges with conductive bond pads arranged transversely relative to the rows of outer leads. A first portion of inner leads is off-die wire bonded to some of the bond pads, and a second portion of inner leads is insulatively attached as LOC leads between the bond pads along the opposed die edges. The hybrid package results in shorter inner leads of increased pitch enabling improved line yield at wire bond and encapsulation, as well as improved electrical performance, particularly for packages with very small dice.

12 Claims, 5 Drawing Sheets

U.S. PATENT DOCUMENTS

| | | |
|---|---|---|
| 5,227,662 A | 7/1993 | Ohno et al. |
| 5,229,639 A | 7/1993 | Hansen et al. |
| 5,231,755 A | 8/1993 | Emanuel |
| 5,233,220 A | 8/1993 | Lamson et al. |
| 5,234,866 A | 8/1993 | Okinaga et al. |
| 5,252,853 A | 10/1993 | Michii |
| 5,286,679 A | 2/1994 | Farnworth et al. |
| 5,304,842 A | 4/1994 | Farnworth et al. |
| 5,331,200 A | 7/1994 | Teo et al. |
| 5,331,201 A | 7/1994 | Nishino |
| 5,352,633 A | 10/1994 | Abbott |
| 5,418,189 A | 5/1995 | Heinen |
| 5,461,255 A | 10/1995 | Chan et al. |
| 5,466,888 A | 11/1995 | Beng et al. |
| 5,471,369 A | 11/1995 | Honda et al. |
| 5,475,918 A | 12/1995 | Kubota et al. |
| 5,521,426 A | 5/1996 | Russell |
| 5,592,019 A | 1/1997 | Ueda et al. |
| 5,663,594 A | 9/1997 | Kimura |
| 5,883,427 A | 3/1999 | Arimoto |
| 5,907,769 A | 5/1999 | Corisis |
| 6,150,710 A | 11/2000 | Corisis |
| 6,201,297 B1 | 3/2001 | Masuda |
| 6,259,153 B1 | 7/2001 | Corisis |

METHOD FOR TRANSVERSE HYBRID LOC PACKAGE

CROSS-REFERENCE TO RELATED APPLICATIONS

This application is a continuation of application Ser. No. 09/832,539, filed Apr. 11, 2001, now U.S. Pat. No. 6,406,943 B2, issued Jun. 18, 2002, which is a continuation of application Ser. No. 09/614,403, filed Jul. 12, 2000, now U.S. Pat. No. 6,259,153 B1, issued Jul. 10, 2001, which is a continuation of application Ser. No. 09/302,196, filed Apr. 29, 1999, now U.S. Pat. No. 6,150,710, issued Nov. 21, 2000, which is a divisional of application Ser. No. 09/137,782, filed Aug. 20, 1998, now U.S. Pat. No. 6,124,150, issued on Sep. 26, 2000.

BACKGROUND OF THE INVENTION

Field of the Invention: The present invention relates to semiconductor devices in general and, more particularly, to the configuration of Leads-Over-Chip (LOC) semiconductor devices.

State of the Art: Modern packaged integrated circuits (IC) comprise one or more encapsulated semiconductor devices, dice or chips within a protective "package" of plastic, ceramic or other moldable material. Typically, a large number of dice are formed from a wafer made from a semiconductor material such as silicon, germanium or gallium arsenide. Microscopic circuits are formed on a surface of each semiconductor die by photolithographic techniques and typically attached to a lead frame with conductive wires. More particularly, a plurality of leads of the lead frame is connected to bond pads on the semiconductor die or dice, enabling the dice to be electrically interconnected to an external electrical host apparatus, typically mounted on a circuit board.

Early semiconductor devices used relatively large semiconductor dice with peripheral bond pads. Off-die leads were wire-bonded to the peripheral bond pads. With the later introduction of Leads-Over-Chip (LOC) technology, the package size using large semiconductor die could be reduced. This was accomplished by using centrally positioned conductive bond pads on the semiconductor dice and insulatively bonding the inner leads to the semiconductor die surface close to the bond pads for wire connection. Thus, the semiconductor die and lead frame were more intimately joined, and the outer leads could be formed close to or adjacent the semiconductor die.

In early LOC devices, the semiconductor dice were relatively large, consuming most of the package space. The numbers of leads attached to the semiconductor dice were also limited. Thus, wide and short leads which closely approached the bond pads on the active surface of the semiconductor die were used. The resulting wirebonds were short, and the inductance between the semiconductor die and the host apparatus was low. Examples of such are found in U.S. Pat. No. 5,227,661 of Heinen, U.S. Pat. No. 5,233,220 of Lamson et al., U.S. Pat. No. 5,252,853 of Michii, U.S. Pat. No. 5,331,200 of Teo et al., U.S. Pat. No. 5,418,189 of Heinen, and U.S. Pat. No. 5,466,888 of Beng et al.

In later generation IC devices, the semiconductor dice have become progressively smaller while the numbers of leads of the lead frame have typically increased. As a result, the inner leads of the lead frame of such devices must of necessity be reduced in lead width and pitch, both of which increase the lead inductance and slow the speed of the device. In addition, a minimum lead width is required for high-quality wire bonding. The high density of wire connections typically makes wire bonding more difficult and increases the frequency of bond failures. Furthermore, with very small semiconductor dice, the very fine wires may be very long, resulting in "wire sweep," sagging, short circuiting and bond failure during encapsulation of the semiconductor die and lead frame. For a very small semiconductor die, fitting all of the inner leads of the lead frame onto the active surface of the semiconductor die is generally not possible, given the present size and space limitations. Even conventional off-die wire bonding is very difficult or not possible in production scale.

High inductance and reduced speed limit the usefulness of packaged semiconductor dice with long, narrow leads, and shorting or destruction of the wire bonds will make the device useless.

The required spacing, width and length of leads and wires have become serious limitations in further miniaturization of semiconductor dice and their packages. While complex integrated circuits may be formed in very small semiconductor die, connecting such a die or dice to leads for interconnection to a host apparatus while maintaining the semiconductor die characterization is very difficult.

There have been various attempts at overcoming the high inductance or interactive conductance effects of small semiconductor die devices. For example, in U.S. Pat. No. 5,521,426 of Russell is disclosed a lead-on-chip (LOC) device with long, narrow leads. In order to decrease the capacitance between the leads and the die and increase lead strength, the leads are stamped or rolled to have a non-rectangular cross-section such as a "U" configuration. Thus, the strength of the lead and its cross-sectional area are increased, resulting in less lead sag and lowered capacitative interaction. However, the cost of producing such leads is considerable, and the package thickness is increased. Furthermore, the method does not increase the size of wire bonding areas on the lead fingers, and the wire bonding operation is no easier.

In U.S. Pat. No. 4,984,059 of Kubota et al., a semiconductor device is shown with the long sides of the die parallel to the rows of outer lead ends, i.e. in a non-transverse configuration. The device has a very limited number of pins.

U.S. Pat. No. 5,218,229 of Farnworth discloses a lead frame design in which a semiconductor die with opposing rows of peripheral bond pads on the active surface of the die is positioned for off-die wire attachment. The rows of bond pads are perpendicular to the two rows of outer lead ends.

U.S. Pat. No. 4,989,068 of Yasuhara et al. shows a semiconductor device in which all leads are LOC leads between two rows of peripheral bond pads.

None of the above prior art documents discloses a high-speed semiconductor device having a large number of bond pads on a small die, whereby the lead inductance is minimized and wire bonding operations are enhanced. The need exists for such a device.

SUMMARY OF THE INVENTION

In the invention, an improved device uses a hybrid lead frame/semiconductor die configuration wherein a semiconductor die having peripheral or near-peripheral bond pads is positioned in a transverse direction relative to the lead frame. The inner leads, i.e. lead fingers, include a set of lead fingers configured to be wire-bonded off-die to peripheral bond pads and another set of lead fingers configured for lead-over-chip (LOC) attachment inside of the row(s) of wire bond pads. The resulting device has lead fingers of increased width and pitch.

As a result of this hybrid lead frame/semiconductor die configuration, (a) lead inductance is decreased to ensure signal integrity, (b) wire bonding is faster, easier, and more accurate, (c) wire bond integrity and reliability are enhanced, (d) the shorter wires avoid problems with "wire sweep", (e) the lead frame is stronger and less subject to damage in handling, (f) signal integrity is increased, (g) the speed grade of the device is increased because of the reduced lead/wire inductance, and (h) a higher value product may be manufactured at lower cost.

BRIEF DESCRIPTION OF THE SEVERAL VIEWS OF THE DRAWINGS

The drawings presented herein illustrate the prior art and the advances of the present invention, in which the figures are not necessarily drawn to scale, whereby.

DETAILED DESCRIPTION OF THE INVENTION

The invention is illustrated and compared with prior art devices, which for purposes of illustration are examples with the same number of pins, i.e. 54.

Figure 1:
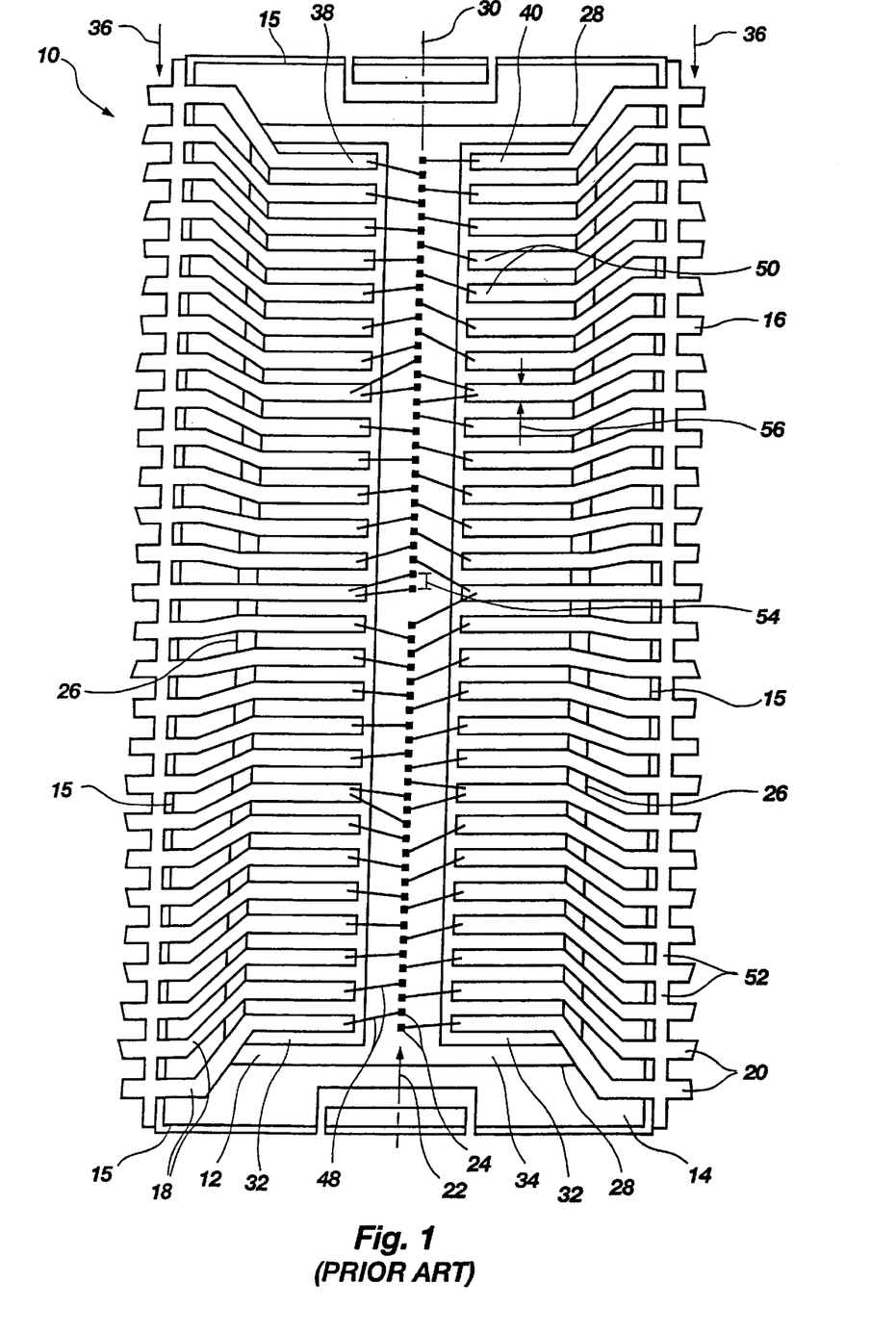
FIG. 1 is a plan view of a semiconductor die and attached 54-pin lead frame of an exemplary earl generation prior art semiconductor device.
Figure 1A:
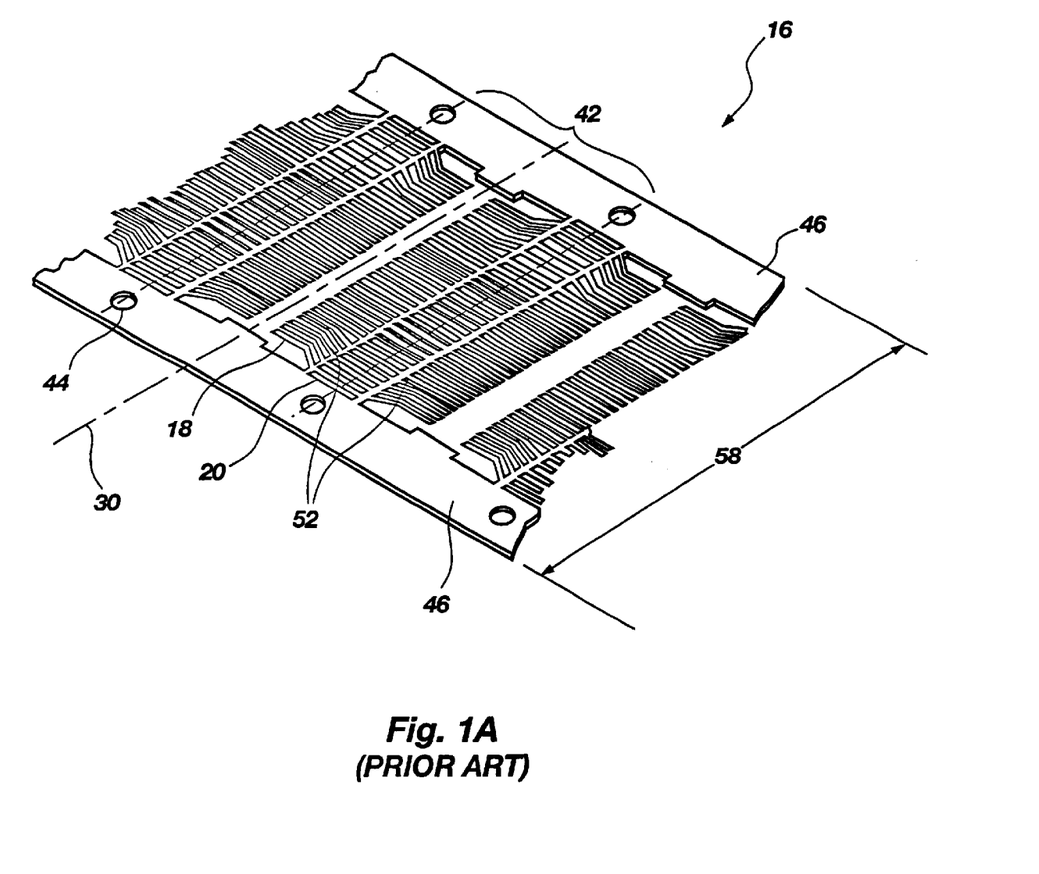
FIG. 1A is a perspective, partial view of a semiconductor lead frame of an early generation prior semiconductor device.

A die and lead frame configuration of an early generation prior art leads-over-chip (LOC) semiconductor device 10 is illustrated in drawing FIGS. 1 and 1A. As shown, the relatively large semiconductor die 12 is mounted on a substrate 14 with outlined edges 15. A row 22 of electrically conductive bond pads 24 with spacing 54 is located on the active surface of the semiconductor die 12 and aligned generally along the longitudinal centerline 30, parallel to the opposing long sides 26 of the die 12, and extending generally between the opposing short sides 28. Two insulative layers 32 of Kapton polymer or similar material are adhesively joined to the active surface 34 of die 12, one on each side of the bond pad row 22. A conductive lead frame 16 is shown with inner leads 18 adhesively joined to the insulative layers 32. The lead frame 16 comprises inner leads 18 and outer leads 20 for connecting the bond pads 24 to an electrical apparatus, not shown. As shown, the outer leads 20 are directed outward from the device 10 on opposite sides 36, i.e the long sides, of the lead frame 16. Thus, the single central row 22 of bond pads 24 is parallel to the two opposing sides 36 of outer lead ends 38, 40.

As depicted in drawing FIG. 1, the inner ends 50 of the inner leads 18 comprise wire bonding areas for attachment of conductive wires 48 leading to specific bond pads 24 on the semiconductor die 12.

Following wire bonding, the semiconductor die 12 and attached lead frame 16 are typically encapsulated with a polymer or ceramic material to form a packaged device. The dam bars 52 between the outer leads 20 are cut away, and the outer leads are thus singulated, enabling electrical connection of the bond pads 24 to an electronic apparatus, not shown, with minimum lead inductance. The outer leads 20 may be left as straight projections, or bent to a J-shape, L-shape or other shape, depending upon the apparatus to which the device 10 is to be connected.

A typical prior art lead frame 16 is shown in drawing FIG. 1A as having a recurring pattern 42 of inner leads 18 and outer leads or pins 20 for accommodating a plurality of single semiconductor dice having longitudinal centerline 30. The leads 18, 20 are temporarily interconnected to each other and to the supportive lead frame rails 46 by dam bars 52. Index holes 44 in the lead frame rails 46 permit sequential positioning of the lead frame 16 in a wire bonding machine for joining the semiconductor die to the leads 18, 20. The lead frame 16 has a width 58 typically ranging from less than about one inch (2.54 cm.) to several inches or more.

In this early version of a LOC device, the large semiconductor die 12 enabled the inner leads 18 to be of sufficient width 56 (FIG. 1) to avoid significant resistance and/or inductance effects, particularly at the design speeds typical of that period. The current need for much higher speeds with smaller dice has limited the usefulness of these early devices.

An exemplary LOC semiconductor device 10 of a later generation is shown in drawing FIG. 2 following wire bonding. The semiconductor die 12 and lead frame 16 are configured the same as die 12 and lead frame 16 of drawing FIG. 1. For purposes of comparison, the overall lead frame width 58 may be assumed to be the same as the lead frame width of FIG. 1A. The semiconductor die 12 is similar to the die of FIG. 1 with respect to its central bond pad location along the centerline 30. However, the reduced size of the semiconductor die 12 provides about one third of the surface area of the earlier die 12 of drawing FIG. 1, and the bond pad spacing or pitch 54 is considerably reduced, i.e by nearly 50 percent. In drawing FIG. 2, the semiconductor die 12 is shown adhesively attached to a substrate 14 and has two insulative layers 32 on its active surface 34 upon which inner leads 18 of the lead frame 16 are adhesively attached. The inner lead widths 56 are reduced by about 50 percent to accommodate the smaller semiconductor die 12. In addition, many of the inner leads 18 have an increased length.

Figure 2:
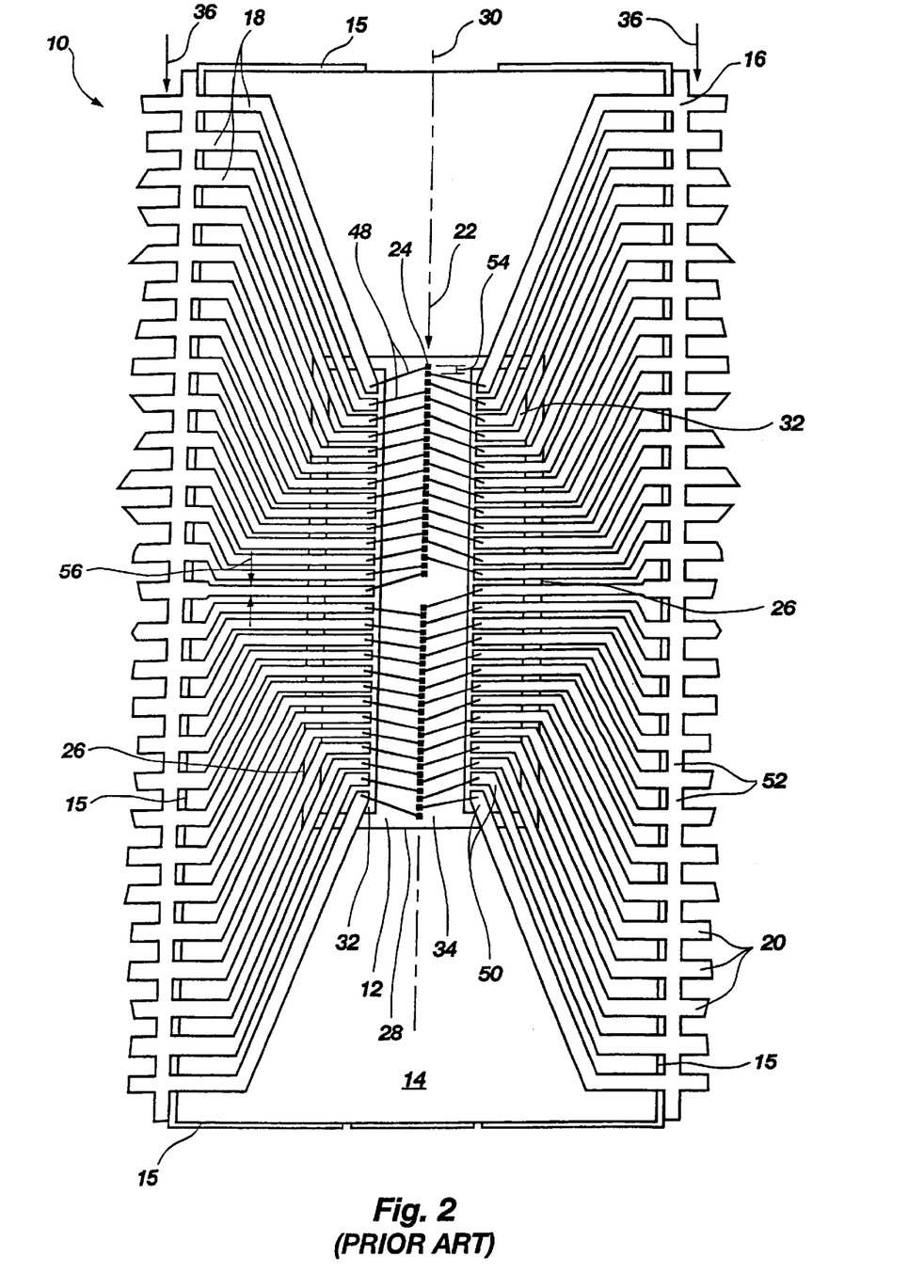
FIG. 2 is a plan view of a semiconductor die and attached lead frame of an exemplary later generation prior art semiconductor device.

Thus, the smaller semiconductor die 12 as depicted in drawing FIG. 2 has an increased susceptibility to resistance and inductance effects which severely limit usefulness of the device. In addition, manufacture of the device is made more difficult by the limited room for wire bonding the crowded bond pads to the narrow inner leads 18.

It should be noted that the devices 10 may be formed without a permanent substrate 14. The semiconductor die 12 may be separately supported during attachment of the LOC lead frame 16, and the final encapsulated package outline may be represented by the edges 15.

Figure 3:
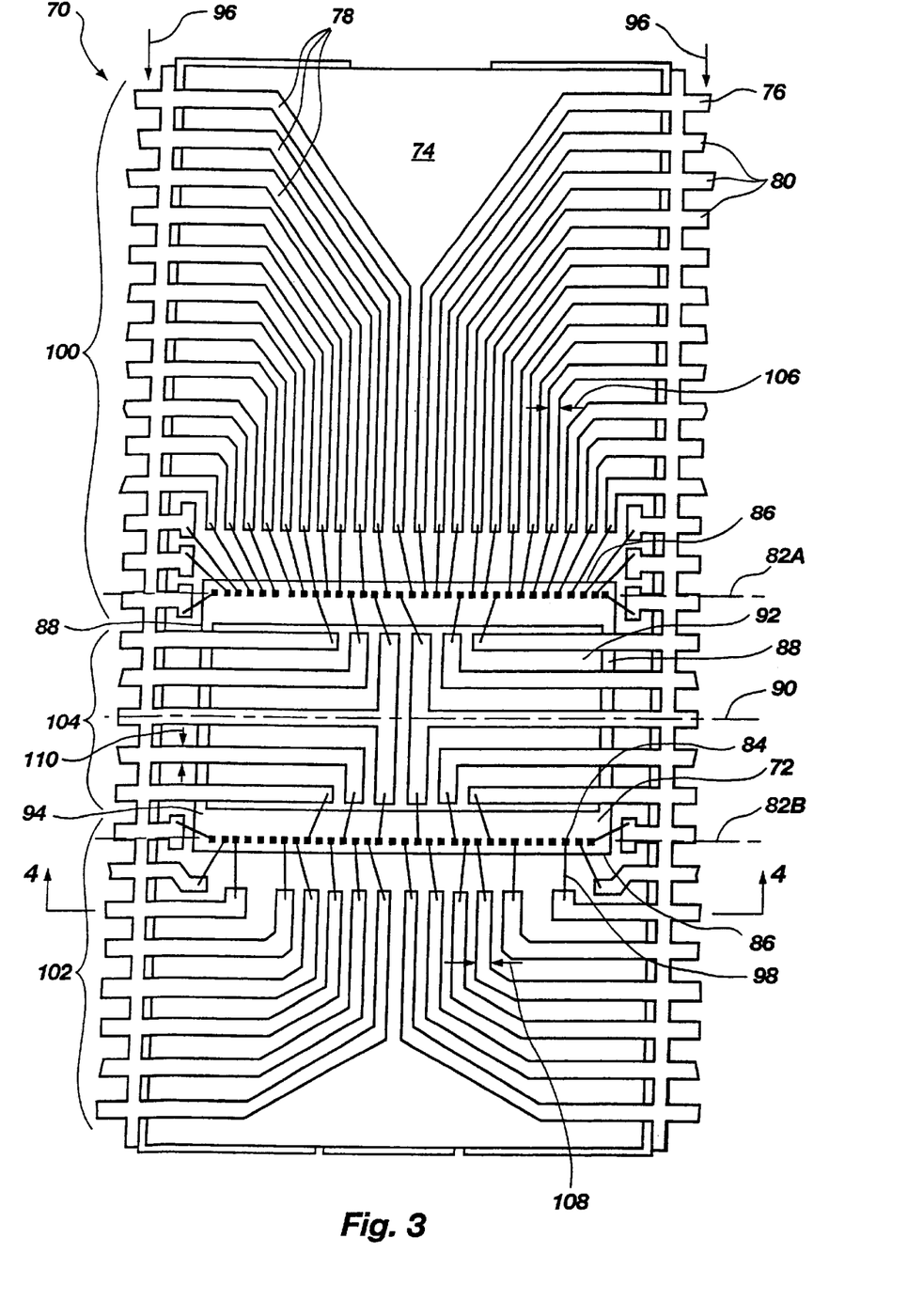
FIG. 3 a plan view of a semiconductor die and attached lead frame of an exemplary hybrid semiconductor device of the present invention.
Figure 4:
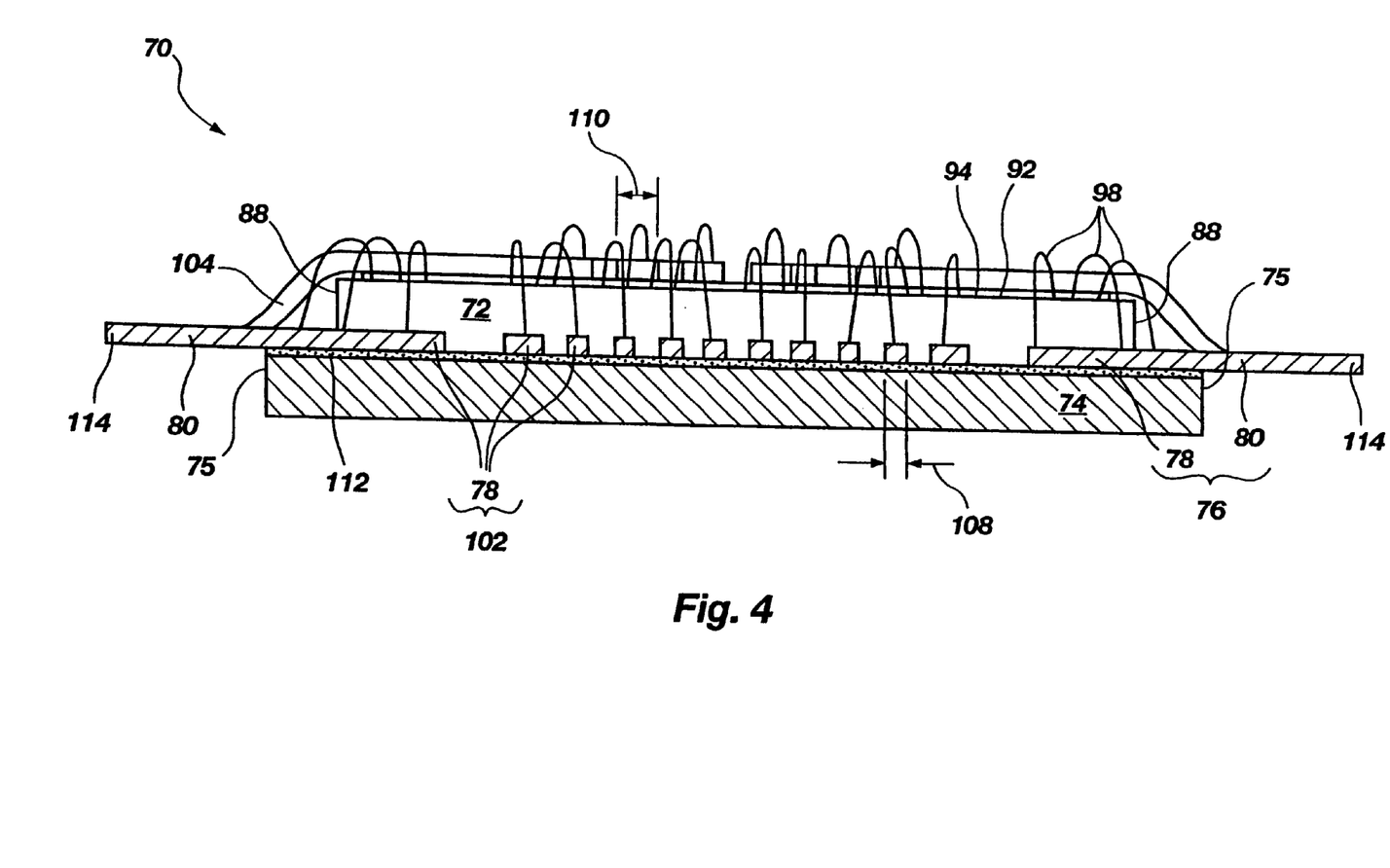
FIG. 4 is a cross-sectional end view of a semiconductor die and attached lead frame of an exemplary hybrid semiconductor device of the invention, as taken along line 4—4 of FIG. 3.

Turning now to drawing FIGS. 3 and 4, a device 70 having a semiconductor die 72/lead frame 76 configuration of the invention is depicted. The semiconductor die 72 is positioned transversely relative to the lead frame 76, i.e. such that its long sides 86 are perpendicular to the opposing rows 96 of outer lead ends. The semiconductor die 72 is shown as having peripheral rows 82A, 82B of bond pads 84 along opposing long sides 86, parallel to the longitudinal centerline 90 of the semiconductor die 72. The rows 82A, 82B of bond pads 84 are shown as generally extending between the opposed short sides 88 of the semiconductor die 72.

The lead frame 76 is shown with three sets 100, 102, 104 of inner leads 78 and outer leads 80. A first set 100 has inner leads 78 which are positioned off-die for wire-bonding with wires 98 to bond pads 84 of row 82A. A second set 102 has inner leads 78 which are also positioned off-die for wire-bonding with wires 98 to bond pads 84 of row 82B.

A third set 104 has inner leads 78 which are adhesively joined to the active surface 94 of the die 72 with an intervening insulative layer 92, i.e. as leads-over-chip (LOC) leads. The third set 104 is positioned between the two rows 82A, 82B of bond pads 84 and includes leads wire-bonded to both rows.

In the example shown, the minimum width 106 of the critical function non-LOC inner leads 78 of lead set 100 in device 70 is about 30-60 percent greater than the minimum width 56 of the comparable leads in device 10 of drawing FIG. 2. The twelve LOC leads 78 of lead set 104 are shown as having a width 110 nearly double that of width 56 of the bulk of the LOC leads 18 of the prior art device of drawing FIG. 2.

The sixteen non-LOC leads 78 of lead set 102 are shown to have a width 108 which is about 30 to 100 percent greater than the width 56 of nearly all LOC leads 18 of the device of drawing FIG. 2.

The twenty eight non-LOC leads 78 of lead set 100 are shown as having a width 106 roughly comparable to the width 56 of nearly all LOC leads of the device of drawing FIG. 2. Thus, in this example, critical leads subject to inductance have a greater width while non-critical leads are formed with a reduced width. The lead widths may be adjusted as needed for the particular use of the device.

The invention presents, on average, inner leads having a shorter length of the minimum width portions than the prior art device of drawing FIG. 2. Moreover, the range of lead lengths is much greater. Thus, in the particular example of drawing FIG. 3, twelve leads with very abbreviated lengths are positioned near the semiconductor die corners to carry critical signals subject to inductance.

As shown in drawing FIG. 4, the device 70 is formed by adhesively joining a semiconductor die 72 to a substrate 74 with an intervening insulative layer 112. The hybrid lead frame 76 includes a set 102 of inner leads 78 which are attached by conductive wires 98 to a row 82B of bond pads 84 (FIG. 3). Another set 104 of inner leads 78 overlies the active surface 94 of semiconductor die 72 in a LOC configuration and is adhesively joined to the die with an intervening insulative layer 92. In this embodiment, the LOC lead set 104 is thus at a different level than the non-LOC lead sets 102 (and 100, not visible in FIG. 4). The outer leads 80 terminate in lead ends 114 which may be straight or formed as J-leads or L-leads, etc., as known in the art. The lead widths 108 and 110 are illustrated in the figure.

Following the wire bonding operation, the lead frame 76 and attached semiconductor die 72 are encapsulated and extraneous lead frame portions excised to form a device package.

The device 70 may be formed without a permanent substrate 74. The semiconductor die 72 may be separately supported during attachment of the LOC lead frame 76, and the final encapsulated package outline may be represented by the edges 75. In this embodiment, the non-LOC leads and LOC leads may be in the same horizontal plane.

As explained in the foregoing description, the invention provides wider and generally shorter inner leads 78 for small dice 72. This obviates problems with inductance at high speed operation, making the design extremely useful for state-of-the-art applications.

The LOC leads overlying a large portion of the active surface also result in enhanced heat transfer, improving the overall operation of the device.

In addition, the larger leads and greater pitch enable a much improved wire-bonding operation in terms of speed and integrity.

While the invention has been described using a semiconductor die 72 with a pronounced difference in lengths of the long sides 86 and short sides 88, the term "long side" includes sides having a length equal to or greater than that of the "short side". The semiconductor die 72 is shown as rectangular in surface shape, but may be of other shapes provided space is provided between two sets of bond pads for entry of a significant number of LOC leads.

It is apparent to those skilled in the art that there is provided herein according to the invention a transverse hybrid LOC semiconductor package particularly useful with small dice and in enhancing the construction and operability of a semiconductor package. Although the device has been described and illustrated with reference to a specific embodiment thereof, it is not intended that the invention be limited by the illustrated embodiment. Those skilled in the art will recognize that various modifications can be made without departing from the spirit and intent of the invention. For example, the invention is not limited to devices having a specific number or type of leads, bond pads, or dice, nor to a device with a permanent substrate supporting the die. Thus, it is intended that this invention encompass all such modifications and variations which fall within the scope of the appended claims.

What is claimed is:

1. An assembly method for a semiconductor device comprising:

providing a semiconductor die having an active surface, having a pair of opposed long sides, each opposed long side of said pair of opposed long sides having a set of bond pads positioned therealong, and having a pair of opposed short sides;

providing a lead frame for transverse attachment to said semiconductor die, said lead frame having at least two opposed rows of outer lead ends and at least two sets of inner leads including a first set of inner leads for off-die wire attachment to bond pads of one of said sets of bond pads and a second set of inner leads for LOC wire attachment to bond pads of at least one of said sets of bond pads;

attaching said second set of inner leads to at least one bond pad of said at least one of said sets of bond pads of said semiconductor die; and connecting said first set of said inner leads to said one of said sets of bond pads using at least one bond wire.

2. The method of claim 1, further comprising:

encapsulating said semiconductor die, said first set of inner leads and said at least one bond wire.

3. The method of claim 1, further comprising:

singulating said at least two opposed rows of outer lead ends.

4. The method of claim 1, further comprising:

adhesively attaching a portion of said semiconductor die and a portion of said lead frame to a substrate.

5. An assembly method for a hybrid semiconductor device comprising:

providing a semiconductor die having an active surface, having two opposed long sides, each opposed long side of said two opposed long sides having a set of at least two bond pads positioned therealong, and having two opposed short sides;

providing a lead frame for transverse attachment to said semiconductor die, said lead frame having at least two opposed rows of outer lead ends and a plurality of sets of inner leads including a first set of inner leads for off-die wire attachment to bond pads of one of said sets of bond pads and a second set of inner leads for LOC wire attachment to bond pads of at least one of said sets of bond pads;

attaching said second set of inner leads of said plurality of sets of inner leads to said semiconductor die;

connecting at least one inner lead of said plurality of sets of inner leads to at least one bond pad of said sets of bond pads using a wire bond.

6. The method of claim 5, further comprising:

encapsulating said semiconductor die, said plurality of sets of inner leads, and said wire bond.

7. The method of claim 5, further comprising:

singulating said at least two opposed rows of outer lead ends.

8. The method of claim 5, further comprising:

adhesively connecting at least a portion of said semiconductor die and a portion of said lead frame to a substrate.

9. An assembly method for a hybrid semiconductor device comprising:

providing a semiconductor die having an active surface, having at least two opposed long sides, each opposed long side of said at least two opposed long sides having a set of at least two bond pads positioned therealong;

providing a lead frame for transverse attachment to said semiconductor die, said lead frame having at least two opposed rows of outer lead ends and a plurality of sets of inner leads including a first set of inner leads for off-die wire attachment to bond pads of one of said sets of bond pads and a second set of inner leads for LOC wire attachment to bond pads of at least one of said sets of bond pads;

attaching said second set of inner leads of said plurality of sets of inner leads to said semiconductor die;

connecting said plurality of sets of inner leads to said sets of bond pads using a plurality of wire bonds; and encapsulating said semiconductor die, said plurality of sets of inner leads and said plurality of wire bonds.

10. The method of claim 9, further comprising:

singulating said at least two opposed rows of outer lead ends.

11. The method of claim 9, further comprising:

adhesively connecting at least a portion of said semiconductor die and a portion of said lead frame to a substrate.

12. An assembly method for a hybrid semiconductor device comprising:

providing a semiconductor die having an active surface having a plurality of opposed long sides, each opposed long side of said plurality of opposed long sides having a set of at least two bond pads positioned therealong;

providing a lead frame for transverse attachment to said semiconductor die, said lead frame having at least two opposed rows of outer lead ends and a plurality of sets of inner leads including a first set of inner leads for off-die wire attachment to bond pads of one of said sets of bond pads and a second set of inner leads for LOC wire attachment to bond pads of at least one of said sets of bond pads;

attaching said second set of inner leads of said plurality of sets of inner leads to said semiconductor die;

connecting said plurality of sets of inner leads to said sets of bond pads using a plurality of wire bonds;

encapsulating said semiconductor die, said plurality of sets of inner leads and said plurality of wire bonds;

singulating at least one row of said at least two opposed rows of outer lead ends; and adhesively attaching said semiconductor die and a portion of said lead frame to a supportive substrate.

* * * * *

UNITED STATES PATENT AND TRADEMARK OFFICE
CERTIFICATE OF CORRECTION

PATENT NO.     : 6,531,342 B2
DATED          : March 11, 2003
INVENTOR(S)    : David J. Corisis

It is certified that error appears in the above-identified patent and that said Letters Patent is hereby corrected as shown below:

Title page, Item [54] and Column 1, line 1,
Title, change "METHOD" to -- METHODS --

Title page,
Item [73], Assignee, change "Inst., to -- Inc., --

Signed and Sealed this

Eighth Day of June, 2004

JON W. DUDAS
*Acting Director of the United States Patent and Trademark Office*